United States Patent
Fuderer

(10) Patent No.: US 7,218,107 B2
(45) Date of Patent: May 15, 2007

(54) ADAPTIVE IMAGE HOMOGENEITY CORRECTION FOR HIGH FIELD MAGNETIC RESONANCE IMAGING

(75) Inventor: Miha Fuderer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/570,076

(22) PCT Filed: Aug. 30, 2004

(86) PCT No.: PCT/IB2004/002840

§ 371 (c)(1),
(2), (4) Date: Mar. 1, 2006

(87) PCT Pub. No.: WO2005/024725

PCT Pub. Date: Mar. 17, 2005

(65) Prior Publication Data
US 2007/0024281 A1  Feb. 1, 2007

Related U.S. Application Data

(60) Provisional application No. 60/500,210, filed on Sep. 4, 2003.

(51) Int. Cl.
*G01V 3/00* (2006.01)
(52) U.S. Cl. .................. 324/309; 324/318
(58) Field of Classification Search ........ 324/309, 324/308, 307, 300, 318, 319, 322; 600/410–445
See application file for complete search history.

(56) References Cited

U.S. PATENT DOCUMENTS

| | | | | |
|---|---|---|---|---|
| 4,745,365 A | * | 5/1988 | Ugenti | 327/37 |
| 4,875,012 A | * | 10/1989 | Maeda et al. | 324/309 |
| 5,001,428 A | | 3/1991 | Maier et al. | 324/309 |
| 6,037,775 A | * | 3/2000 | Shenoy et al. | 324/320 |
| 6,462,543 B2 | | 10/2002 | Pittaluga et al. | 324/308 |
| 7,088,099 B2 | * | 8/2006 | Doddrell et al. | 324/309 |

FOREIGN PATENT DOCUMENTS

JP    7 059750 (A)    3/1995

OTHER PUBLICATIONS

Brown, L.G.; A Survey of Image Registration Techniques; 1992; ACM Computing Surveys; 24(4)325-376.
Van Leemput, K., et al.; Automated Model-Based Bias Field Correction of MR Images of the Brain; 1999; IEEE Trans. On Med. Imaging; 18(10)885-896.
Velthuizen, R.P., et al.; Review and Evaluation of MRI nonuniformity corrections for brain Tumor response measurements; 1998; Medical Physics; 25(9) 1655-1666.
Wicks, D.A.G., et al.; Correction of Intensity Nonuniformity in MR Images of any Orientation; 1993; MRM; 11:183-196.

* cited by examiner

*Primary Examiner*—Brij B. Shrivastav
(74) *Attorney, Agent, or Firm*—Thomas M. Lundin

(57) ABSTRACT

An apparatus for producing a corrected reconstructed image from magnetic resonance imaging data acquired by a magnetic resonance imaging scanner (10) includes a reconstruction processor (44) that reconstructs a corrected reconstructed image from acquired magnetic resonance imaging data. A parameters calculation processor (52) determines at least one characteristic of the imaging subject. A correction pattern adjustment processor (54) selects a correction pattern from a family of stored correction patterns based on the at least one characteristic. An image correction processor (56) corrects the uncorrected reconstructed image using the selected correction pattern to produce the corrected reconstructed image.

22 Claims, 5 Drawing Sheets

ADAPTIVE IMAGE HOMOGENEITY CORRECTION FOR HIGH FIELD MAGNETIC RESONANCE IMAGING

CROSS REFERENCE TO RELATED APPLICATIONS

Figure 1:
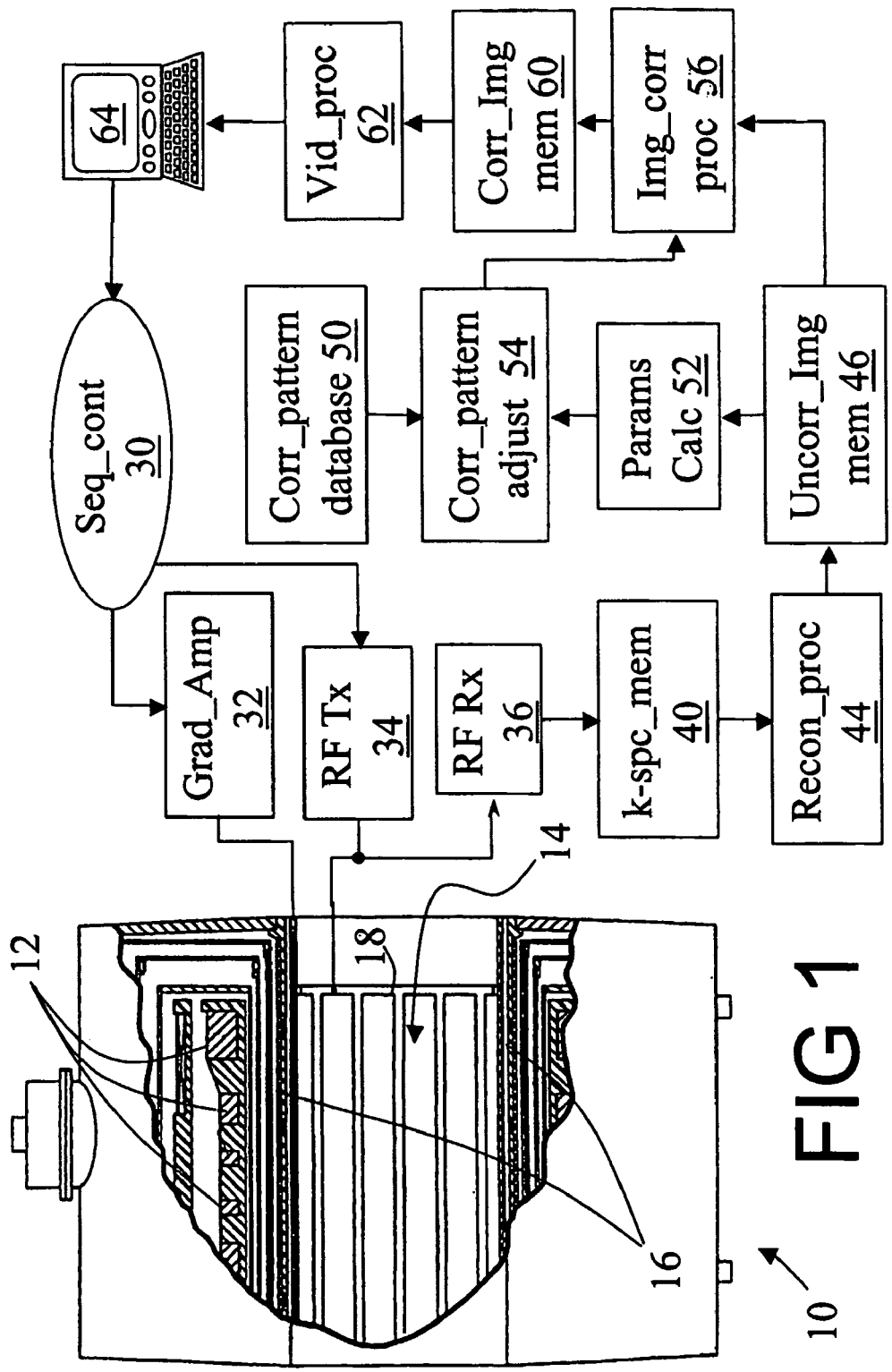

This application claims the benefit of U.S. provisional application Ser. No. 60/500,210 filed Sep. 4, 2003, which is incorporated herein by reference.

The following relates to the diagnostic imaging arts. It finds particular application in magnetic resonance imaging at high magnetic fields (especially greater than or about 3 T), and will be described with particular reference thereto. However, it also finds application in magnetic resonance imaging at lower magnetic fields, in magnetic resonance spectroscopy, and the like.

In magnetic resonance imaging, dielectric and conductance properties of tissues cause spatial distortions of the magnetic resonance excitation and of the magnetic resonance signal due to dephasing, rephasing, and so forth. These distortions become more severe at higher magnetic field due to a shortened magnetic resonance wavelength. The magnetic resonance wavelength $\lambda_{res}$ in the imaging subject is given by:

$$\lambda_{res} = \frac{c}{\sqrt{\varepsilon} \cdot \gamma \cdot B}, \qquad (1)$$

where c is the speed of light having a value of about $c=3\times10^8$ meters per second, $\gamma$ is the gyromagnetic ratio having a value of about $\gamma=42$ MHz/T, B is a magnitude of the magnetic field in tesla, and $\varepsilon$ is a dielectric constant of material comprising the imaging subject.

For $\varepsilon^{1/2} \sim 9$ (a typical value for human tissue) and a modest magnetic field of B=1.5 T, the resonance wavelength in the subject is about 53 cm, which is slightly larger than the dimensions of a typical imaging region of interest. At a larger field B=3.0 T that is typical for some present-generation clinical magnetic resonance scanners, the resonance wavelength in the subject decreases to about 26 cm, which is comparable to or smaller than dimensions of a typical imaging region of interest. Hence, for magnetic fields of about 3.0 T or higher, spatial distortions due to dielectric and conductance properties of the imaging subject are especially problematic. Even for lower fields, however, such as at B=1.5 T, these distortions can be problematic for clinical imaging applications.

Dielectric and conductivity effects cause distortions in the magnetic resonance excitation. For the exemplary 3.0 T case, these effects can cause a nominally 90° radio frequency excitation pulse to produce a spatially variable flip angle in the subject that varies spatially by about a factor of 2. That is, although a nominally 90° flip angle is intended, the local flip angle may vary over a range of about 70° to about 140°. Similar distortions occur during magnetic resonance reception. These distortions lead to artificially varying intensities across the reconstructed image, and are also expected to produce contrast problems.

In the past, distortions due to dielectric and conductivity effects have been addressed by ad hoc intensity corrections applied to specific images. For example, if one half of the image is brighter on average than the other half as might be found where the wavelength is comparable to the size of the imaging volume, the brighter image half is multiplied by a dimming factor to produce a visually pleasing image having good overall intensity uniformity. Such ad hoc approaches are generally not justified by statistical analyses of multiple imaging subjects or by first principles electromagnetic modeling. As a result, such an ad hoc correction may erroneously "correct" intensity variations across the reconstructed image that correspond to physical features of the imaging subject. Moreover, such ad hoc corrections are generally spatially coarse (for example, balancing intensities of image quadrants).

The present invention contemplates an improved apparatus and method that overcomes the aforementioned limitations and others.

According to one aspect, a method is provided for producing a corrected reconstructed image from acquired magnetic resonance imaging data. A stored correction pattern is provided. The acquired magnetic resonance imaging data is reconstructed into an uncorrected reconstructed image of an imaging subject. At least one characteristic of the imaging subject is determined. A correction pattern is selected from a family of stored correction patterns based on the at least one characteristic. The uncorrected reconstructed image is corrected using the selected correction pattern to produce the corrected reconstructed image.

According to another aspect, an apparatus is disclosed for producing a corrected reconstructed image from acquired magnetic resonance imaging data. A means is provided for reconstructing the acquired magnetic resonance imaging data into an uncorrected reconstructed image of an imaging subject. A means is provided for determining at least one characteristic of the imaging subject. A means is provided for selecting a correction pattern from a family of stored correction patterns based on the at least one characteristic. A means is provided for correcting the uncorrected reconstructed image using the selected correction pattern to produce the corrected reconstructed image.

One advantage resides in providing intensity correction for dielectric and conductance properties of the imaging subject based on an empirical or first principles analysis of the magnetic resonance imaging scanner and the imaging subject.

Another advantage resides in providing a correction for distortions caused by dielectric and conductance properties of the imaging subject using a spatial correction pattern that is generated independent of the specific imaging subject, but which is adjusted to compensate for positioning, size, aspect ratio, or other characteristics of the imaging subject in the specific reconstructed image being corrected.

Yet another advantage resides in providing a first correction for distortions introduced during magnetic resonance excitation and a second correction for distortions introduced during magnetic resonance reception.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance imaging system including a magnetic resonance imaging scanner and an apparatus for producing a corrected reconstructed image from acquired magnetic resonance imaging data.

Figure 2:
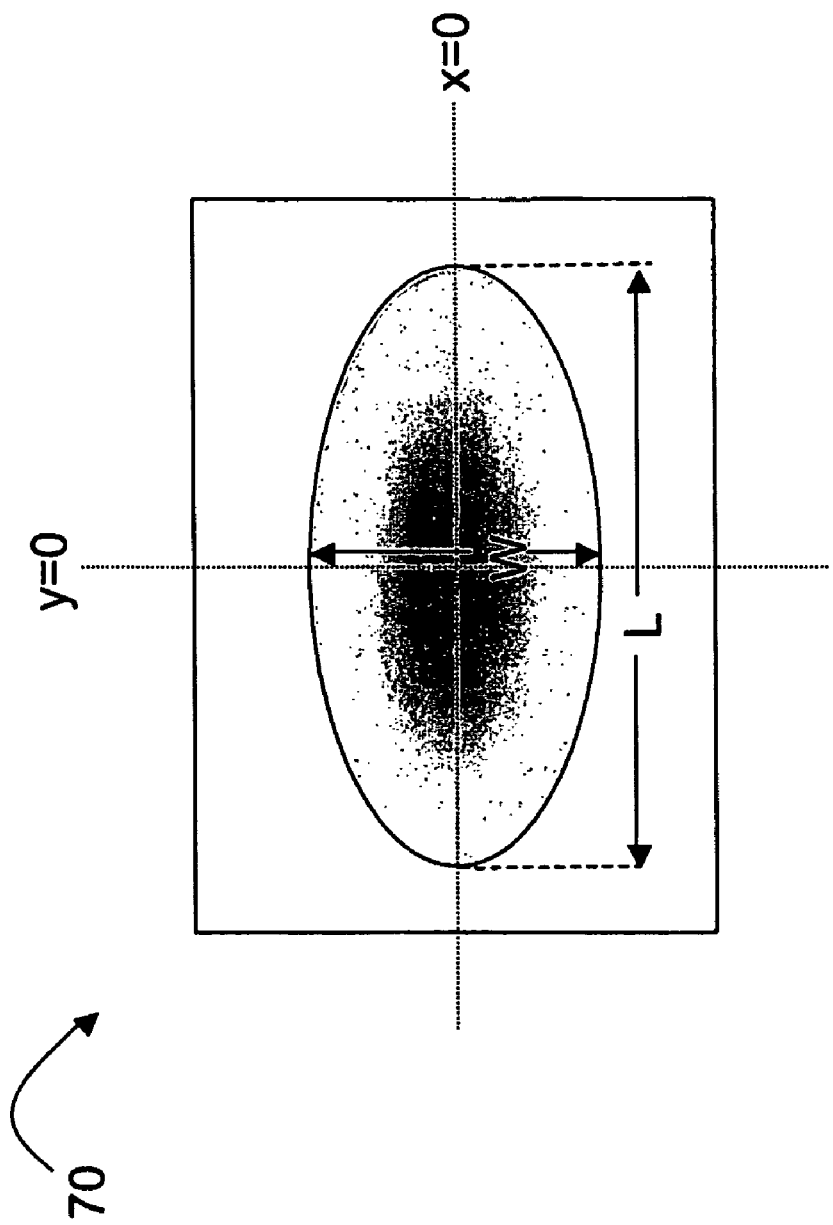

FIG. 2 diagrammatically shows a stored correction pattern.

Figure 3:
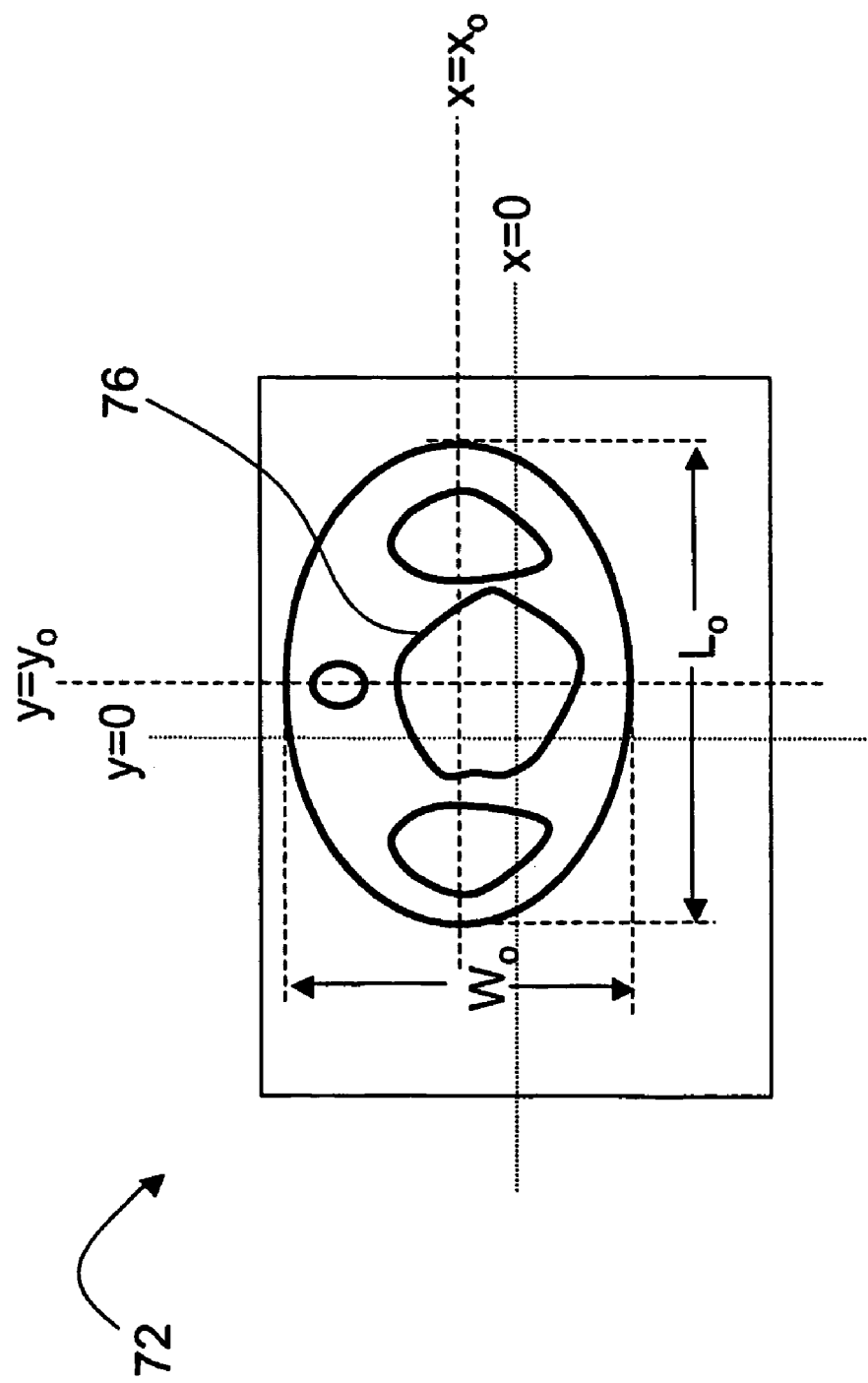

FIG. 3 diagrammatically shows determination of selected characteristics of an imaging subject in an uncorrected reconstructed image.

Figure 4:
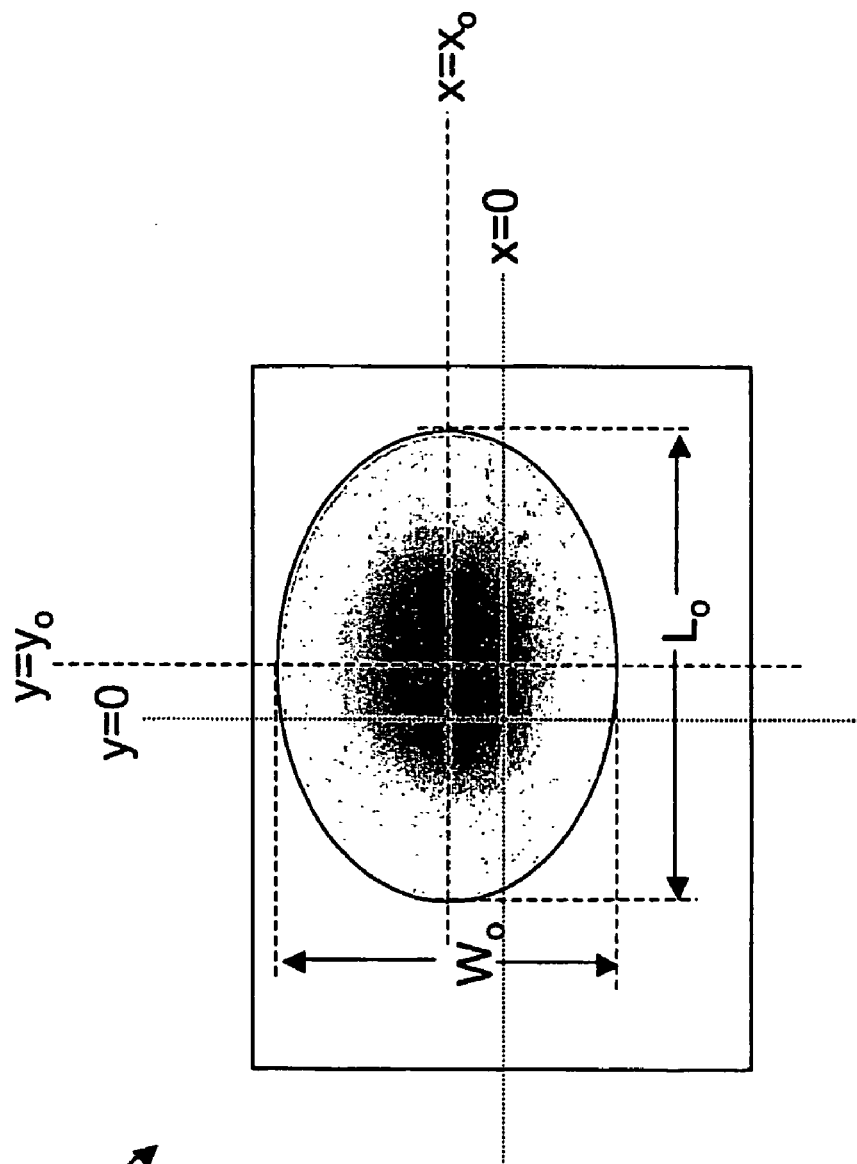

FIG. 4 diagrammatically shows an adjusted correction pattern produced by adjusting the stored correction pattern of FIG. 2 based on the characteristics of the imaging subject in the uncorrected reconstructed image determined in accordance with FIG. 3.

Figure 5:
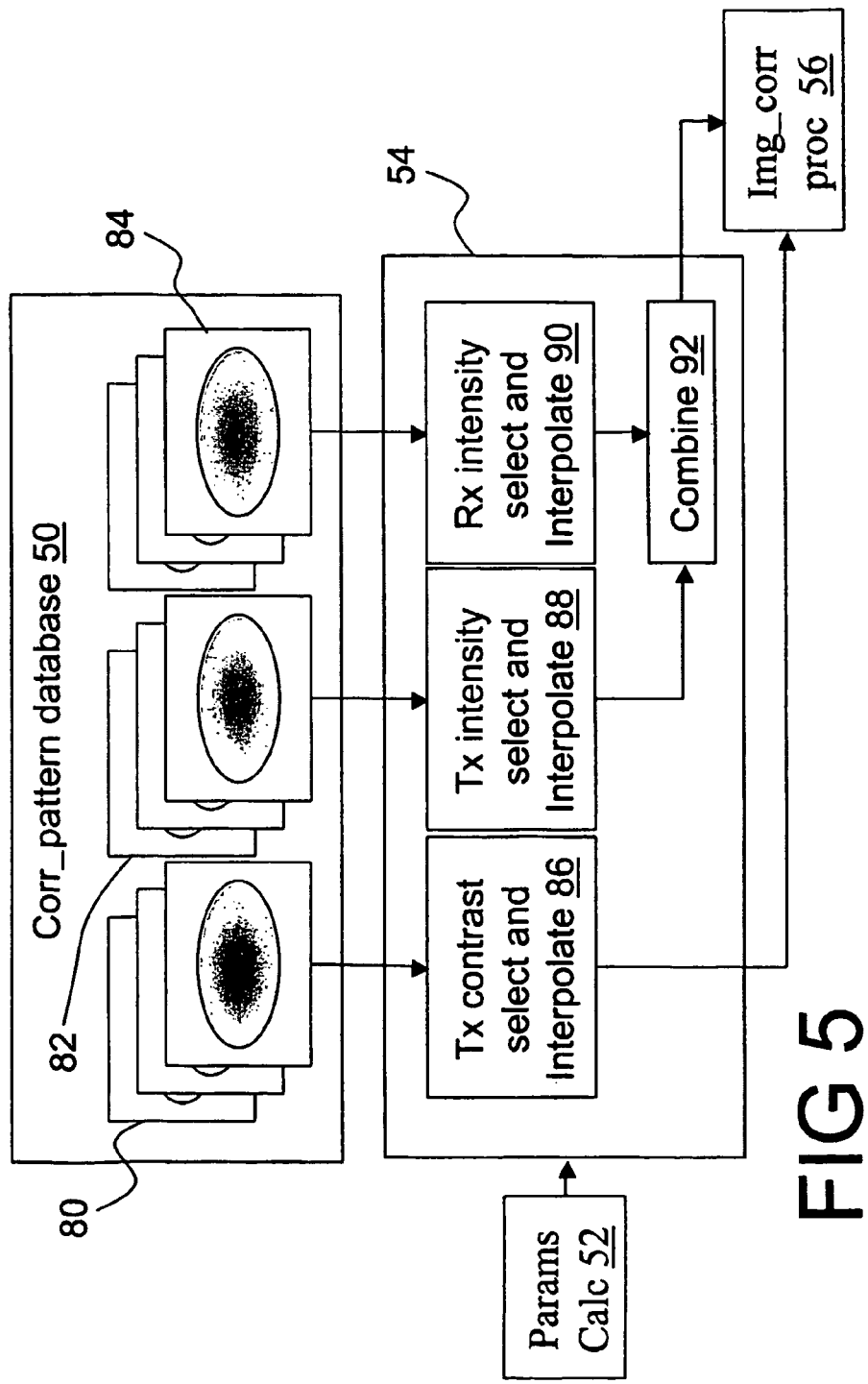

FIG. 5 diagrammatically shows a preferred embodiment of the correction patterns database and correction patterns adjustment processor.

With reference to FIG. 1, a magnetic resonance imaging scanner 10 includes main magnet coils 12, which are preferably superconducting coils, although resistive main magnet coils or a permanent magnet can also be employed. The main magnet coils 12 are energized to generate a substantially uniform main magnetic field in an examination region 14. Magnetic field gradient coils 16 produce magnetic field gradients in selected spatial directions to spatially encode magnetic resonances that are generated by energizing a radio frequency coil 18. In FIG. 1, a whole-body radio frequency coil 18 is shown; however, local coils such as head coils, phased radio frequency coil arrays, SENSE coils, and the like can be used instead of or in conjunction with the whole-body radio frequency coil 18 to excite magnetic resonances and/or to detect magnetic resonance echoes.

A magnetic resonance sequence controller 30 coordinates and controls a radio frequency transmitter 34 that is coupled to the whole-body radio frequency coil 18 or another radio frequency coil to excite magnetic resonance echoes, and controls magnetic field gradient controllers 32 coupled to the gradient coils 16 to spatially encode the excited magnetic resonance echoes. One or more radio frequency receivers 36 coupled to the whole-body radio frequency coil 18 or another radio frequency coil detects, demodulates, and preferably digitizes the magnetic resonance echoes and stores preferably digital magnetic resonance samples in a k-space memory 40. A reconstruction processor 44 performs a Fourier transform-based image reconstruction or other type of image reconstruction to generate an uncorrected reconstructed image from the stored k-space magnetic resonance samples. The uncorrected reconstructed image is stored in an uncorrected image memory 46.

The uncorrected reconstructed image typically has distortions due to dielectric and conductance properties of the imaging subject. To correct these distortions, a stored correction pattern retrieved from a correction patterns database 50 is employed. The stored correction pattern is selected based on magnetic field strength, imaging subject type and orientation, imaging scan type, and so forth. In a preferred embodiment, one criterion for selecting the stored correction pattern is a roundness of the subject. Roundness is suitably defined, for example, as a ratio between a short-axis length and a long-axis length of the imaging subject. The stored correction pattern is used to adjust intensities of image elements of the uncorrected reconstructed image to compensate for intensity distortions introduced by dielectric and conductance properties of the imaging subject.

To compensate for differences in position, size, aspect ratio, image resolution, or other characteristics of the imaging subject compared with the retrieved stored correction pattern, a parameters calculation processor 52 analyzes the uncorrected reconstructed image or a pre-scan pilot image to determine the position, size, aspect ratio, image resolution, or other characteristics of the imaging subject in the uncorrected reconstructed image. A correction pattern adjustment processor 54 adjusts the stored correction pattern to generate an adjusted correction pattern that substantially matches up in terms of position, size, aspect ratio, image resolution, and so forth, with the imaging subject in the uncorrected reconstructed image.

An image correction processor 56 applies the adjusted correction image to the uncorrected reconstructed image to generate a corrected reconstructed image in which distortions due to dielectric and conductance properties of the imaging subject are substantially reduced. The corrected reconstructed image is stored in a corrected image memory 60, processed by a video processor 62 and displayed on a user interface 64, transmitted over a local computer network or the Internet, or otherwise processed. Preferably, the user interface 64 includes a display, printer, or other output device that allows a radiologist or other operator to view, render, or otherwise manipulate the reconstructed images. Moreover, the user interface 64 preferably enables the radiologist or other operator to communicate with the magnetic resonance sequence controller 30 to create magnetic resonance imaging sequences, modify imaging sequences, execute imaging sequences, or otherwise control the magnetic resonance imaging scanner 10.

With continuing reference to FIG. 1 and with further reference to FIGS. 2–4, a preferred image correction process implemented by the components 50, 52, 54, 56 is described. FIG. 2 shows a diagrammatic stored correction pattern 70 retrieved from the correction patterns database 50. The correction pattern 70 is appropriate for an imaging subject arranged centered at a position (0, 0) in the imaging plane and having a length L along the x-dimension, a width W along the y-dimension, and an aspect ratio W/L. The diagrammatic stored correction pattern 70 corresponds, for example, to a two-dimensional axial plane image slice of a human imaging subject taken through the thoracic region. In the illustrated example, a larger correction is called for in a central ovoid region where tip angles are reduced. Because intensity can vary with resonance wavelength, very high field scanners can have more complex patterns with a plurality of high and low intensity correction regions. Typically, a family of correction patterns with a range of sizes and aspect ratios W/L is stored in the correction patterns database 50.

FIG. 3 shows a diagrammatic representation of a two-dimensional axial image slice 72 of a human imaging subject taken through the thoracic region. The imaging subject is arranged centered at a position $(x_o, y_o)$ in the imaging plane and has a length $L_o$ along the x-dimension that is smaller than the corresponding length L of the stored correction pattern 70, a width $W_o$ along the y-dimension that is larger than the corresponding width W of the stored correction pattern 70, and an aspect ratio $W_o/L_o$ that is larger than the aspect ratio W/L of the stored correction pattern 70.

Determination of the characteristic position $(x_o, y_o)$ and dimensional values $L_o, W_o$ are performed by the parameters calculation processor 52. The measurements can be performed automatically using an edge-finding algorithm to identify edges of the imaging subject and a center finding algorithm to identify the center position $(x_o, y_o)$ from the identified edges. The edge-finding algorithm suitably employs spatial derivatives, convolution, or the like to enhance edges or can employ other )mown image processing techniques, such as pre-scan projection images in the x- and y-directions, for identifying edges. The center finding algorithm can be a simple mid-point computation (that is, selecting the mid-point along the length $L_o$ in the x-dimension as $x_o$ and the midpoint along the width $W_o$ in the y-dimension as $y_o$), or the center finding algorithm can be a more complex algorithm known to the art, such as iterative erosion.

Because of the positional offset ($x_o$, $y_o$) and dimensional differences between the image slice 72 and the stored correction pattern 70, straightforward application of the correction pattern 70 to the image slice 72 will typically produce unsatisfactory results. Hence, prior to performing the image correction, the correction pattern adjustment processor 54 makes adjustments to the stored correction pattern to shift or otherwise match the pattern up with the imaging subject in the uncorrected reconstructed image.

FIG. 4 shows the adjusted correction pattern 74 output by the correction pattern adjustment processor 54. In a suitable approach, the correction pattern adjustment processor 54 adjusts a resolution of the stored correction pattern 70 to match a resolution of the image slice 72. With reference back to Equation (1), the resonance wavelength in the imaging subject for magnetic fields of less than about B=8 T is greater than about 10 cm. The correction pattern is expected to be relatively slowly varying on a scale comparable to the resonance wavelength in the imaging subject. Hence, the stored correction pattern 70 can have a coarse resolution on the order of about 1–2 cm. In contrast, the image slice 72 will typically have a higher resolution on the order of 0.1–0.2 cm or better. Thus, the correction pattern adjustment processor 54 preferably interpolates, employs spline curve fits, or otherwise increases a number of elements of the stored correction pattern 70 to produce a higher resolution correction pattern with the resolution of the image slice 72.

After adjusting the resolution of the stored correction pattern to match the resolution of the image slice, the correction pattern adjustment processor 54 adjusts the position, size, and aspect ratio of the stored correction pattern to match with the imaging subject in the image slice 72. A suitable adjustment of the correction pattern is given by:

$$F_{adj}(x, y) = A_{scale} \cdot F\left(\left(\frac{L}{L_o}\right) \cdot (x - x_o), \left(\frac{W}{W_o}\right) \cdot (y - y_o)\right), \quad (2)$$

where $F(x,y)$ is the stored correction pattern 70 shown in FIG. 2 after matching resolution with the image slice 72, $F_{adj}(x,y)$ is the adjusted correction pattern 74 shown in FIG. 4, and $A_{scale}$ is an optional scaling factor for adjusting overall image brightness. The difference terms ($x-x_o$) and ($y-y_o$) correct for the difference in position along the x-dimension and y-dimension, respectively, while the ratios $L/L_o$ and $W/W_o$ correct for the difference in size along the x-dimension and y-dimension, respectively. The combination of the ratios $L/L_o$ and $W/W_o$ correct for the difference in aspect ratio.

The described operation of the correction pattern adjustment processor 54 is exemplary only. Additional imaging subject-specific parameters can be similarly adjusted. For example, a rotation of the imaging subject relative to the stored correction pattern 70 can be accounted for using the conventional rotation transformation:

$$\begin{pmatrix} x' \\ y' \end{pmatrix} = \begin{bmatrix} \cos\alpha & \sin\alpha \\ \cos\alpha & -\sin\alpha \end{bmatrix} \begin{pmatrix} x \\ y \end{pmatrix}, \quad (3)$$

where $\alpha$ is a rotation between the (x', y') and (x, y) coordinate systems. In another contemplated variation a portion of the stored correction pattern 70, such as a portion corresponding to a heart 76 shown in FIG. 3 or other organ, is locally translated, stretched, or shrunk to account for an enlarged heart or other individual variation in that portion.

Moreover, rather than employing a single base correction pattern and adjusting the base correction pattern for the dimensional differences with correction factor ratios $L/L_o$ and $W/W_o$ in accordance with Equation (2), $F_{adj}(x,y)$ can be computed using a linear interpolation of two or more correction patterns retrieved from the correction patterns database 50 having the closest sizes and aspect ratios to the imaged subject. These closest correction patterns are translated using the ($x-x_o$) and ($y-y_o$) shift terms to align with the center ($x_o$, $y_o$) and are resolution-adjusted to match resolution with the image slice 72. The closest correction patterns are interpolated to produce an interpolated correction pattern with length $L_o$ and width $W_o$. Optionally, a combination of interpolation and ratio correction can be employed. For example, interpolation can be employed to substantially account for size differences, and correction factor ratios $L/L_o$ and $W/W_o$ can be used to adjust for a different aspect ratio.

The adjusted correction pattern 74 is applied by the image correction processor 56 to correct for distortions caused by dielectric or conductance effects. In one suitable embodiment, spatial elements of the adjusted correction pattern 74 contain multiplicative scaling factors that account for intensity variations introduced into the image by dielectric or conductance effects of the imaging subject. In this embodiment, image elements of the uncorrected reconstructed image are multiplied by corresponding spatial elements of the adjusted correction pattern 74 to effect the correction. The correction in this embodiment compensates for distortions introduced during both excitation and receive imaging phases.

Variations in dielectric and conductivity characteristics across the subject results in intensity variations though various mechanisms. Tip angle variations result in both intensity and contrast variations. Magnetic resonance receive sensitivity also varies spatially across the imaging subject. The correction pattern database 50 optionally stores not just a family of intensity correction patterns, but also a family of contrast correction patterns. The contrast patterns are used analogously to guide the spatially selective application of a contrast enhancement algorithm. For example, the gray scale can be expanded in proportion (linear, exponential, power, et cetera) to the tip angle variation.

The intensity and contrast patterns can be measured from a family of phantoms with the same conductivity, dielectric constant, and other characteristics as human or other imaging subjects. The family of phantoms also includes phantoms for different regions of the body. Alternatively, the patterns can be calculated based on the nominal dielectric constants of the organs and their nominal locations and sizes. When calculating a correction pattern, a transmit pattern which compensates for tip angle variations across the subject and which corrects intensity and contrast is preferably calculated separately from a receive pattern which corrects for sensitivity variations and corrects intensity.

Because some imaging sequences are more influenced by tip angle variations than others, a family of transmit patterns are calculated for different sequences.

With reference to FIG. 5, in one preferred embodiment, the correction pattern database 50 stores two families of correction patterns that are separately applied: stored transmit correction patterns 80, 82 and stored receive correction patterns 84. Each of the selected stored transmit correction patterns and the selected stored receive correction patterns are interpolated by interpolation processors 86, 88, 90 to match with the imaging subject. Spatial elements of the adjusted transmit correction pattern contain flip angle factors indicative of spatial variation in flip angle resulting from dielectric or conductance effects of the imaging subject. The correction is performed in two parts. In a first part, the flip angle is combined with a resonance decay time constant (such as T1, T2, or T2*, depending upon which resonance decay mechanism dominates) to determine a suitable transmit correction on an image element-by-image element basis. In a second part, the adjusted receive correction pattern is applied as a multiplicative correction on an image element-by-image element basis.

In this embodiment, the pattern database 50 holds a large number of profiles. There is a family of transmit contrast adjust patterns 80 to correct for the tip angle variations and a family of transmit intensity adjust patterns 82. The pattern database 50 is addressed by the scan type (sensitivity to tip angle variation), subject size characteristics, and the region of the imaging subject to select the closest transmit patterns. The closest transmit patterns are adjusted and/or interpolated by interpolation processors 86, 88 to form a selected contrast pattern and a selected transmit intensity pattern. The patterns database 50 also stores the family of receive or sensitivity patterns 84 which are addressed by the patient size characteristics and imaging region. The retrieved receive pattern or patterns are adjusted and/or interpolated by the interpolation processor 90 to generate a receive intensity pattern.

The transmit and receive intensity correction patterns are preferably combined by a combining processor 92 to generate a selected intensity correction pattern. The uncorrected image is corrected in accordance with the intensity correction pattern to correct intensity variations. The correction can be applied as a multiplicative or other weighting factor. Similarly, the contrast pattern is used to adjust the contrast of the image. The contrast correction, for example, may spread or increase the gray scale variation linearly, exponentially, by a complex polynomial formula, or the like. The contrast correction will generally vary with the selected scan sequence.

Of course, the various described patterns in the patterns database 50 is exemplary only. The patterns may be combined in various ways to simplify retrieval, reduce storage space, and eliminate pattern combining processing.

Correction of the exemplary two-dimensional axial slice 72 has been described. However, the correction process is readily expanded to correction of a three-dimensional image by using a three-dimensional stored correction pattern, making a translational adjustment of the stored correction pattern in three-dimensional space (that is, translate the three-dimensional correction pattern to an imaging subject center $(x_o, y_o, z_o)$), and including a third z-dimension length correction. Said another way, the correction in three-dimensional space employs a three-dimensional stored correction pattern which, after resolution adjustment to match the image volume resolution, is adjusted according to:

$$F_{adj}(x, y, z) = F\left(\left(\frac{L_x}{L_{x,o}}\right) \cdot (x - x_o),\right. \quad (4)$$

$$\left(\frac{L_y}{L_{y,o}}\right) \cdot (y - y_o),$$

$$\left.\left(\frac{L_z}{L_{z,o}}\right) \cdot (z - z_o)\right),$$

where $F(x,y,z)$ is the stored three-dimensional correction pattern after interpolation to match resolution with the image volume, $F_{adj}(x,y,z)$ is the adjusted volumetric correction pattern, $L_x$, $L_y$, and $L_z$ are the default lengths in the x-, y-, and z-dimensions, respectively for the stored three-dimensional correction pattern, and $L_{x,o}$, $L_{y,o}$, and $L_{z,o}$ are the lengths of the imaging subject in the image volume in the x-, y-, and z-dimensions, respectively. In Equation (4), the overall intensity scaling factor $A_{scale}$ of Equation (2) is omitted to shorten the expression, but can be optionally included in Equation (4) as well.

Alternatively, $F_{adj}(x,y,z)$ can be computed using a linear interpolation of two or more correction patterns retrieved from the correction patterns database 50 having the closest sizes and aspect ratios to the imaged subject. These closest correction patterns are translated using the $(x-x_o)$, $(y-y_o)$, and $(z-z_o)$ shift terms to align with the center $(x_o, y_o, z_o)$ and are resolution-adjusted to match resolution with the image volume. The closest correction patterns are interpolated to produce an interpolated correction pattern with lengths $L_{x,o}$, $L_{y,o}$, $L_{z,o}$. Optionally, a combination of interpolation and ratio correction can be employed.

The correction patterns stored in the correction patterns database 50 preferably correspond to various types of magnetic resonance imaging sequences and imaging regions. Correction patterns are preferably provided for each classification of reconstructed image, such as for axial thoracic images, sagittal thoracic images, coronal thoracic images, axial brain scans, coronal brain scans, coronal knee scans, and so forth, and for each magnetic field typically used in conjunction with the scanner 10.

The stored correction patterns can be generated in various ways. In one approach, magnetic resonance imaging data are acquired for phantoms that are representative of potential imaging subjects and that have suitable dielectric and conductive properties. For example, a phantom constructed using water, alcohols, vinegar, copper sulfate, and other substances that closely mimic tissues of the human body can be used. The phantom can have regions of different properties to mimic specific regions of the potential imaging subject. In another approach, the distortions can be computed by first principles radio frequency modeling using known dielectric and conductivity data for materials comprising the imaging subject and known radio frequency coil sensitivity characteristics. In yet another approach, uncorrected reconstructed images are acquired for a number of sample subjects, and the stored correction pattern is derived from statistic analysis of the sample uncorrected reconstructed images.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method for producing a corrected reconstructed image from acquired magnetic resonance imaging data, the method including:
reconstructing the acquired magnetic resonance imaging data into an uncorrected reconstructed image of an imaging subject;
determining at least one characteristic of the imaging subject;
selecting a correction pattern from a family of stored correction patterns based on the at least one characteristic; and
correcting the uncorrected reconstructed image using the selected correction pattern to produce the corrected reconstructed image.

2. The method as set forth in claim 1, wherein the determining of at least one characteristic includes determining a roundness of the imaging subject.

3. The method as set forth in claim 1, wherein the determining of at least one characteristic includes determining a length of the imaging subject along a first lateral dimension in the uncorrected reconstructed image, and wherein the method further includes:
adjusting a length of the selected correction pattern along the first lateral dimension to match the determined length of the imaging subject along the first lateral dimension.

4. The method as set forth in claim 3, wherein the determining of at least one characteristic further includes determining a length of the imaging subject along a second lateral dimension in the uncorrected reconstructed image, the second lateral dimension being transverse to the first lateral dimension, and wherein the method further includes:
adjusting a length of the selected correction pattern along the second lateral dimension to match the determined length of the imaging subject along the second lateral dimension.

5. The method as set forth in claim 4, wherein the determining of at least one characteristic further includes determining a length of the imaging subject along a third lateral dimension in the uncorrected reconstructed image, the third lateral dimension being transverse to the first and second lateral dimensions, and wherein the method further includes:
adjusting a length of the selected correction pattern along the third lateral dimension to match the determined length of the imaging subject along the third lateral dimension.

6. The method as set forth in claim 1, wherein the determining of at least one characteristic includes determining a length of the imaging subject along a lateral dimension in the uncorrected reconstructed image, and wherein the method further includes:
interpolating stored correction patterns corresponding to different lengths along the lateral dimension to match the correction pattern to the imaged region of the subject.

7. The method as set forth in claim 1, wherein the determining of at least one characteristic includes determining a center of the imaging subject in the uncorrected reconstructed image, and wherein the method further includes:
translating the selected correction pattern to align a center of the correction pattern with the determined center of the imaging subject in the uncorrected reconstructed image.

8. The method as set forth in claim 1, wherein the uncorrected reconstructed image is two-dimensional, and wherein:
the determining of at least one characteristic includes determining center coordinates $(x_o, y_o)$, a length $L_o$ of the imaging subject in the x-direction, and a width $W_o$ of the imaging subject in the y-direction in the uncorrected reconstructed image; and
the selecting of a correction pattern includes adjusting the correction pattern $F(x,y)$ to produce an adjusted correction pattern $F_{adj}(x,y)$ according to:

$$F_{adj}(x, y) \propto F\left(\left(\frac{L}{L_o}\right) \cdot (x - x_o), \left(\frac{W}{W_o}\right) \cdot (y - y_o)\right)$$

where L and W are a length and a width of the correction pattern $F(x,y)$ corresponding to the length $L_o$ and width $W_o$ of the imaging subject in the uncorrected reconstructed image.

9. The method as set forth in claim 1, further including:
determining a resolution of the uncorrected reconstructed image; and
interpolating image elements of the selected correction pattern to produce an adjusted correction pattern having the determined resolution of the uncorrected reconstructed image.

10. The method as set forth in claim 1, wherein the correcting of the uncorrected reconstructed image includes:
multiplying values of image elements of the uncorrected reconstructed image by values of corresponding elements of the correction pattern.

11. The method as set forth in claim 1, further including:
providing a transmit correction pattern and a receive correction pattern;
correcting intensities in the uncorrected reconstructed image in accordance with the transmit and receive correction patterns and correcting contrasts in the uncorrected reconstructed image in accordance with the transmit correction pattern.

12. The method as set forth in claim 1, wherein the correction pattern provides a map of flip angle variation in the subject, and the method further includes:
correcting values of image elements of the uncorrected reconstructed image with correction values computed based on flip angle variations indicated by corresponding elements of the correction pattern.

13. The method as set forth in claim 1, further including:
prior to imaging a selected region of a subject, acquiring magnetic resonance imaging data of a phantom representative of the selected region;
reconstructing the magnetic resonance imaging data of the phantom into a reconstructed phantom image; and
determining the correction pattern from differences in characteristics of the phantom and the reconstructed phantom image.

14. The method as set forth in claim 1, further including:
computing the correction pattern based on characteristics of a magnetic resonance imaging scanner used to acquire the acquired magnetic resonance imaging data, a magnetic field strength, and dielectric and conductive characteristics of the imaging subject.

15. The method as set forth in claim 1, further including:
acquiring magnetic resonance imaging data of a plurality of sample subjects corresponding to the imaging subject;
reconstructing the magnetic resonance imaging data of the sample subjects into sample reconstructed images; and
computing the correction pattern based on statistical analysis of the sample reconstructed images.

16. The method as set forth in claim 1, further including:
generating the correction pattern in accordance with a magnetic resonance wavelength at a magnetic field strength in the imaged region.

17. An apparatus for producing a corrected reconstructed image from acquired magnetic resonance imaging data, the apparatus including:
a means for reconstructing the acquired magnetic resonance imaging data into an uncorrected reconstructed image of an imaging subject;
a means for determining at least one characteristic of the imaging subject;
a means for selecting a correction pattern from a family of stored correction patterns based on the at least one characteristic; and
a means for correcting the uncorrected reconstructed image using the selected correction pattern to produce the corrected reconstructed image.

18. The apparatus as set forth in claim 17, further including:
a database of stored correction patterns indexed at least by magnetic field strength and an image classification, the selecting means accessing the database to retrieve the selected correction pattern.

19. The apparatus as set forth in claim 18, wherein the database stores transmit correction patterns and receive correction patterns.

20. The apparatus as set forth in claim 18, wherein the database stores transmit contrast correction patterns, transmit intensity correction patterns, and receive intensity correction patterns.

21. The apparatus as set forth in claim 18, wherein the selecting means includes one of:
a means for transforming one of the stored correction patterns from the database to produce the selected correction pattern which matches the at least one characteristic of the imaging subject, and
a means for interpolating a plurality of the stored correction patterns from the database to produce the selected correction pattern which matches the at least one characteristic of the imaging subject.

22. A magnetic resonance imaging apparatus including:
a magnetic resonance imaging scanner for acquiring magnetic resonance imaging data of an imaging subject; and
an apparatus as set forth in claim 17 for producing a corrected reconstructed image from magnetic resonance imaging data acquired by the magnetic resonance imaging scanner.

* * * * *